United States Patent
Mangelsdorf

[11] Patent Number: 5,949,990
[45] Date of Patent: Sep. 7, 1999

[54] METHOD OF EFFICIENTLY MODELING TRI-STATE GATES

[75] Inventor: Steven T. Mangelsdorf, Fort Collins, Colo.

[73] Assignee: Hewlett-Packard Co., Palo Alto, Calif.

[21] Appl. No.: 08/761,737

[22] Filed: Dec. 5, 1996

[51] Int. Cl.[6] .............................. G06F 17/00; G06F 9/00; G06F 17/50
[52] U.S. Cl. ................................ 395/500.35; 395/500.37
[58] Field of Search ........................... 395/500, 500.37, 395/500.35; 364/488, 489, 490, 578

[56] References Cited

U.S. PATENT DOCUMENTS

| | | | |
|---|---|---|---|
| 4,827,427 | 5/1989 | Hyduke | 364/489 |
| 4,831,524 | 5/1989 | Furgerson | 364/490 |
| 5,005,136 | 4/1991 | Van Berkel et al. | 364/490 |
| 5,136,185 | 8/1992 | Fleming et al. | 307/443 |
| 5,197,016 | 3/1993 | Sugimoto et al. | 364/490 |
| 5,437,037 | 7/1995 | Furuichi | 364/490 |
| 5,473,546 | 12/1995 | Filseth | 364/489 |
| 5,519,628 | 5/1996 | Russell et al. | 364/489 |
| 5,557,532 | 9/1996 | Jun et al. | 364/491 |
| 5,696,942 | 12/1997 | Palnitkar et al. | 395/500 |
| 5,703,789 | 12/1997 | Beausang et al. | 364/489 |

*Primary Examiner*—Eric W. Stamber
*Assistant Examiner*—Hugh Jones
*Attorney, Agent, or Firm*—Alexander J. Neudeck

[57] ABSTRACT

Methods and associated apparatus for simulating digital logic circuits with a general purpose computer system. A description of a digital logic circuit is converted into executable computer code. The code produced is capable of simulating the circuit's response to a large number of independent sets of circuit stimulus. The code is broken into separate modules which each simulate the circuit's operation during a particular clock phase. Loops within the code are limited in size to make efficient use of the computer's instruction cache and the data cache. Known constant nodes are propagated through the circuit before code is generated to eliminate the generation of unnecessary code. Code is only generated to simulate gates which may switch on a particular phase. Code which does not need to be evaluated during a particular phase is dropped. The circuit is broken into acyclic sets of gates and code is generated to iterate over each acyclic set of gates until stability is reached. A scoring function is used to prioritize which logic gate and which nodes are to be selected for code generation. Tri-state buffers are simulated using boolean operations. Drive-fight checking is also accomplished using boolean operations.

15 Claims, 12 Drawing Sheets

METHOD OF EFFICIENTLY MODELING TRI-STATE GATES

BACKGROUND OF THE INVENTION

1. Field of the Invention

The present invention relates to digital logic simulators. In particular, the present invention relates to digital logic simulators running on a general purpose computer. More particularly, the invention relates to a compiler which translates a gate-level description of a digital logic circuit into an optimized sequence of machine instructions. When this sequence of machine instructions is executed on a computer, the behavior of the digital logic circuit is simulated.

2. Background of the Invention

Digital logic simulators are used in the design and debugging of digital circuits. A digital logic simulator allows the behavior of a circuit design to be checked against the circuit specification. Many digital logic simulators are implemented as programs running on a general purpose computer. Simulating a logic circuit typically involves inputting the circuit design and a set of circuit stimulus to the digital logic simulator. The digital logic simulator then computes the circuit's outputs in response to that stimulus. These outputs are compared with the circuit's specification to determine the correctness of the design.

To debug and verify the correctness of a very large digital circuit, such as a microprocessor, a large amount of circuit stimulus must be simulated. Typically, this stimulus is broken into a number of smaller sets. These smaller sets may only check certain portions of the design which helps the designer locate and correct errors more rapidly. Nevertheless, because of the sheer size of the circuit, and the length of the stimulus files, a significant amount of the design process may be spent waiting for the results of simulations. Therefore, reducing the amount of time a simulation takes to run will decrease design time. Furthermore, increasing the speed of digital logic simulation improves the quality of the design by allowing more circuit stimulus to be applied to the design in the same amount of time. The more circuit stimulus that is applied, the more likely an error is to be detected.

Accordingly, there is a need in the art for faster digital logic simulators. It is also desired that such simulator run on a general purpose computer. Furthermore, such simulator should be portable from one computer architecture to another.

SUMMARY OF THE INVENTION

A computer operable method for increasing the efficiency of computer code generated by a circuit compiler for simulating synchronous digital logic circuits. Tri-state gates are modeled using only boolean operations. This eliminates the need for looping once for each of a plurality of simulation jobs to model a single tri-state gate across those simulation jobs. Also, the computer code generated does not propagate unknown values. This improves the efficiency of the code generated because code is not generated to calculate and store unknown values for each node in the circuit. One way unknown values may occur in a simulation is when a drive fight occurs between two tri-state gates. Drive fights on nodes driven by tri-state gates are detected without using unknown values after the outputs of each tri-state gates which drive a node have been calculated. Code is generated which reviews each tri-state gate connected to a node and sets a flag if that gate is enabled to drive and it's input is not the same as the output. If the flag is set after reviewing all the tri-state gates connected to a node, it indicates a drive fight on that node and the user is notified. The code for each tri-state gate to set the flag consists only of boolean operations. This eliminates the for looping once for each of a plurality of simulation jobs to check a single tri-state gate for a drive fight across multiple simulation jobs.

DETAILED DESCRIPTION OF THE PREFERRED EMBODIMENTS

An important class of digital logic circuits is the synchronous circuit. Synchronous circuits have one or more clocks which control the operation of latches. By controlling the operation of latches, the clocks control the movement of data into, out of, and within the circuit. Clocks are normally specified to toggle with a fixed period and duty cycle. If there are multiple clocks, their relationship to each other is normally fixed. Because the clocks control the movement of data and are fixed in relationship to each other, the simulation of a synchronous circuit may be divided into clock phases. Dividing the simulation into clock phases simplifies the task of simulation by providing clear time instances at which all stimulus is applied to the circuit. Furthermore, the task of simulation may be further simplified by eliminating from consideration any gates which are not active during a particular clock phase.

One way to simulate a digital circuit is to translate each element of the circuit into computer code which, when executed, simulates the operation of that element. This code operates on variables which store the simulated logic value for each node in the circuit. The program which does this translation is called a circuit compiler. In addition to translating a digital circuit into computer code, the circuit compiler may make certain optimizations in that code to speed execution of the simulation. For example, instead of emitting one large program, the circuit compiler may emit multiple smaller programs which simulate the circuits behavior during each clock phase. These are called phase programs. In this manner, the simplifications discussed above may be implemented and any elements which are not active during a particular clock phase may be eliminated and code not emitted for those elements. This will speed execution of the individual phase programs.

Figure 1:
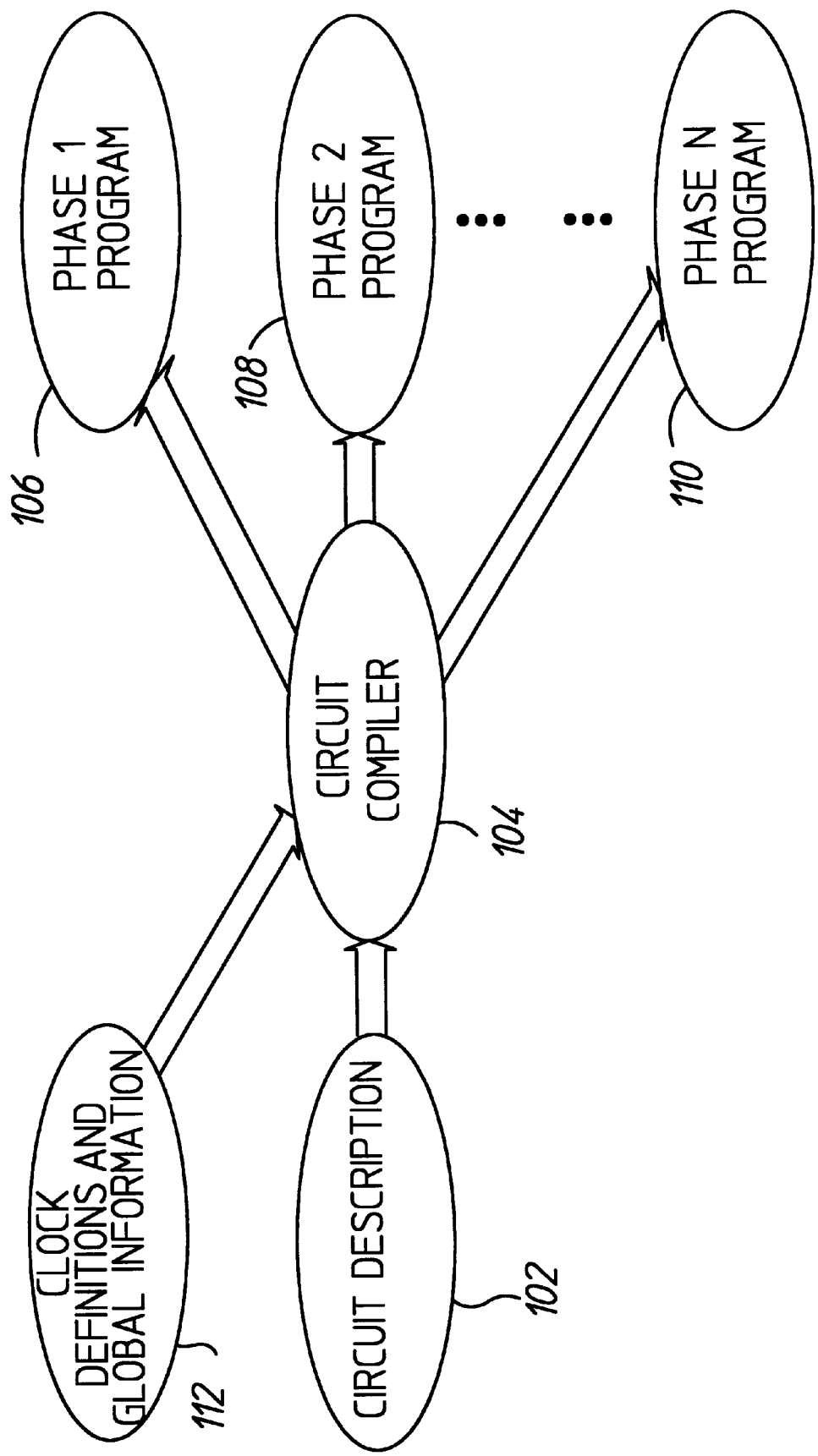
FIG. 1 illustrates the operation of the circuit compiler.

FIG. 1 illustrates the function of the circuit compiler 104. Circuit compiler 104 takes a description of the circuit to be simulated 102, a definition of the clocks and other global information, 112, and produces multiple phase programs 106, 108, and 110. The circuit description 102 is typically in the form of a netlist. The clock definitions and global information 112 may be either embedded in the circuit description 102 or stored as a separate file, or both. The output of the circuit compiler 104 is a series of phase programs 106, 108, and 110. The phase programs are pieces of computer code which, when executed on a computer, mimic the operation of the circuit during a particular clock phase. The phase programs operate on node variables which keep track of the logic value of each node in the circuit.

These phase programs may be output in object code, assembly language, or a higher level language, such as C, which is later compiled into machine language. Furthermore, the phase programs are typically not complete programs, but are subroutines which are called by a simulator program. The simulator program is responsible for reading the stimulus files, applying the stimulus to the circuit by storing the stimulus in the appropriate variable, calling the phase programs, recording the circuit outputs, and other overhead activities.

Figure 2:
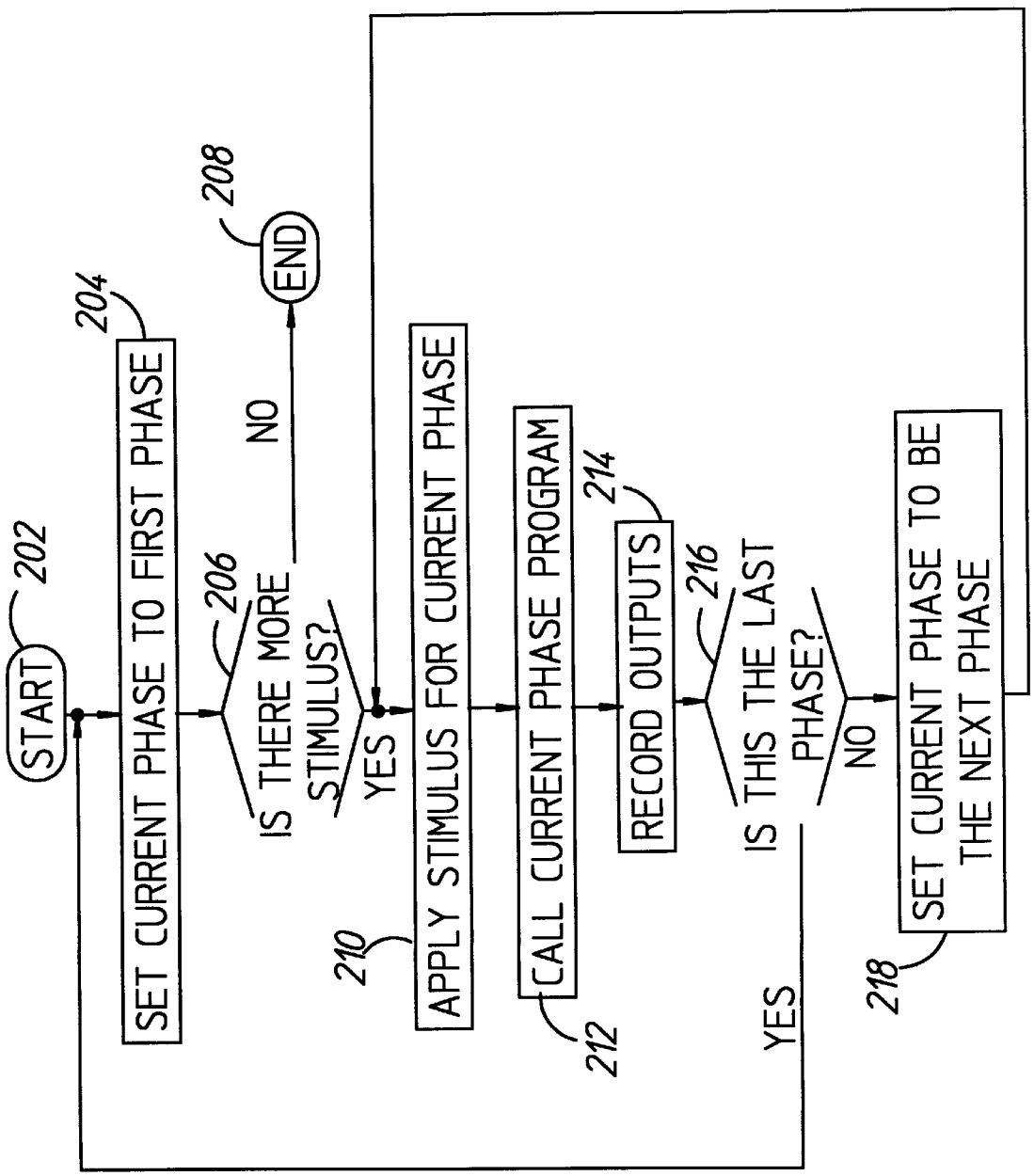
FIG. 2 is a flowchart which illustrates the steps taken during simulation.

FIG. 2 illustrates the steps used by the simulator program. Once the simulator starts 202 it sets the current phase to be the first clock phase in the simulation 204. Then it applies the stimulus for the current phase to the circuit 210. This is done by reading the stimulus file and setting the node variables accordingly. After the stimulus is applied to the circuit, the simulator calls the phase program for the current phase 212. After the phase program for the current phase completes, the node variables contain the logic values the circuit nodes would have upon completion of the current clock phase. The simulator then records values of the node variables which represent the outputs of the circuit 214. These outputs may be actual output nodes or internal nodes which the designer wishes to be visible. If there is another phase, the simulator sets the current phase to be the next phase 218, loops back to 210 and applies the stimulus for that phase. If there is not another phase 218 the simulator loops back to 204 and sets the current phase to be the first phase again. The loop terminates when there is no more stimulus to be applied 206, 208.

Figure 3:
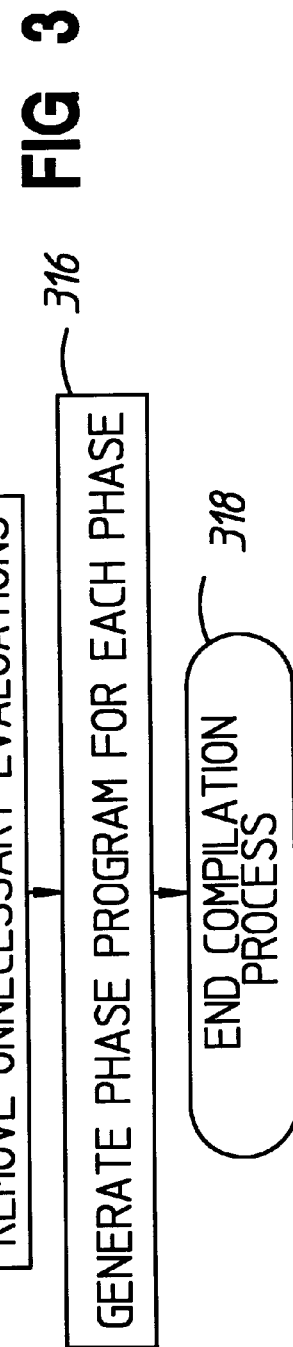
FIG. 3 illustrates the steps taken to generate phase programs.

The process used to generate code for the phase programs is illustrated in FIG. 3. The circuit compiler starts 302 and it's first step is to read in the netlist 304. The netlist is typically a hierarchical description of the circuit describing circuit blocks and their interconnection to each other.

After the hierarchical circuit description in read by the circuit compiler, it is flattened 306. Flattening creates a netlist which consists only of the lowest level (or primitive) circuit elements. In this case, these would be boolean logic functions such as AND, OR, NOT, etc. During the process of flattening, the circuit compiler stores the netlist in data structures which facilitate navigating through the netlist. For example, the data structures are built such that an algorithm can easily find all of the elements connected to a given node, or find all the nodes connected to a given gate.

The next step taken by the circuit compiler is to read in the clock definitions and other global information 308. The compiler needs to know which nodes are clocks, the number of clock phases, and the counting order or value of each clock during each phase. The compiler also needs to know which nodes are powers supplies or grounds, which nodes are primary inputs and during which phases these nodes can change value. Finally, the compiler needs to know which nodes are primary outputs of the circuit or "debug" nodes. "Debug" nodes are designer designated nodes which must be observable during the whole simulation to allow the designer to find design errors. This information may be read in from a separate file, or may be read from certain fields in the netlist.

The circuit compiler then begins simplifying the circuit by propagating constant nodes for each phase through the circuit 310. For example, if the input to an inverter is known to be a constant 1 during a particular phase (perhaps because it is connected to a clock), then the compiler knows that the output node of that inverter must be a constant 0. Pseudo code for propagating constant nodes follows:

```
propagate_constants( )
{
    for (each clock phase (current phase is p)) {
        for (each node (current node is n)) {
            if(n is a clock with a known value during p ||
                n is a power supply or ground) {
                    mark n as a constant 0 or 1 during phase p
                    propagate_constants_visit(p, n)
            }
        }
    }
}
propagate_constants_visit(p, n)
    /* p is the phase number */
    /* n is a node */
    for (each gate with an input of n (current gate is g)) {
        let m be the output node of g
        if(m is not yet marked a constant during phase p) {
            if (any action in the Table A1 applies during p) {
                mark m as a constant 0 or 1 during phase p
                according to Table A1
                propagate_constants_visit(p, m)
            }
        }
    }
}
```

TABLE A1

| Type of gate g | Node n status | Action for node m |
| --- | --- | --- |
| Buffer | constant 0 | constant 0 |
|  | constant 1 | constant 1 |
| Inverter | constant 0 | constant 1 |
|  | constant 1 | constant 0 |
| AND | constant 0 | constant 0 |
| NAND | constant 0 | constant 1 |
| OR | constant 1 | constant 1 |
| NOR | constant 1 | constant 0 |

After the constants have been propagated, the data structure for each node contains information which tells, for each phase, whether that node may switch, is a constant 1, or a constant 0.

Next, the circuit compiler determines the active set for each phase 312. The active set for a phase is defined as those gates whose outputs can change during that phase. Pseudo code for determining the active set for each phase follows:

```
find_active( )
{
    for (every phase (current phase is p)) {
        for (every node (current node is n)) {
            if (n is a clock which transitions between the
                previous phase and phase p || is a primary input
                which transitions during p) {
                    call find_active_visit(p, n)
            }
        }
    }
}
find_active_visit(p, n)
{
    /* p is the phase number */
    /* n is a node */
    if(n is a constant 0 during both phase p and the
        previous phase || n is a constant 1 during both
        phase p and the previous phase) {
            do nothing
    }
    else {
        for(each gate with an input of n(current gate is g)) {
            if(g is not already marked active during p) {
                if(g is a latch whose enable is a constant 0
                    during phase p ||
                    g is a tristate Buffer whose enable is a
                    constant 0 during phase p) {
                        do nothing
                }
                else {
                    let m be the output node of g
                    mark g as active during phase p
                    call find_active_visit(p, m)
                }
            }
        }
    }
}
```

After the active sets have been determined, the data structure for each node contains information which tells whether that gate may change its output during a particular phase. This information is called the phase set for the gate. In other words, the phase set for a gate is a list of phases for which that gate is in the active set.

Figure 4:
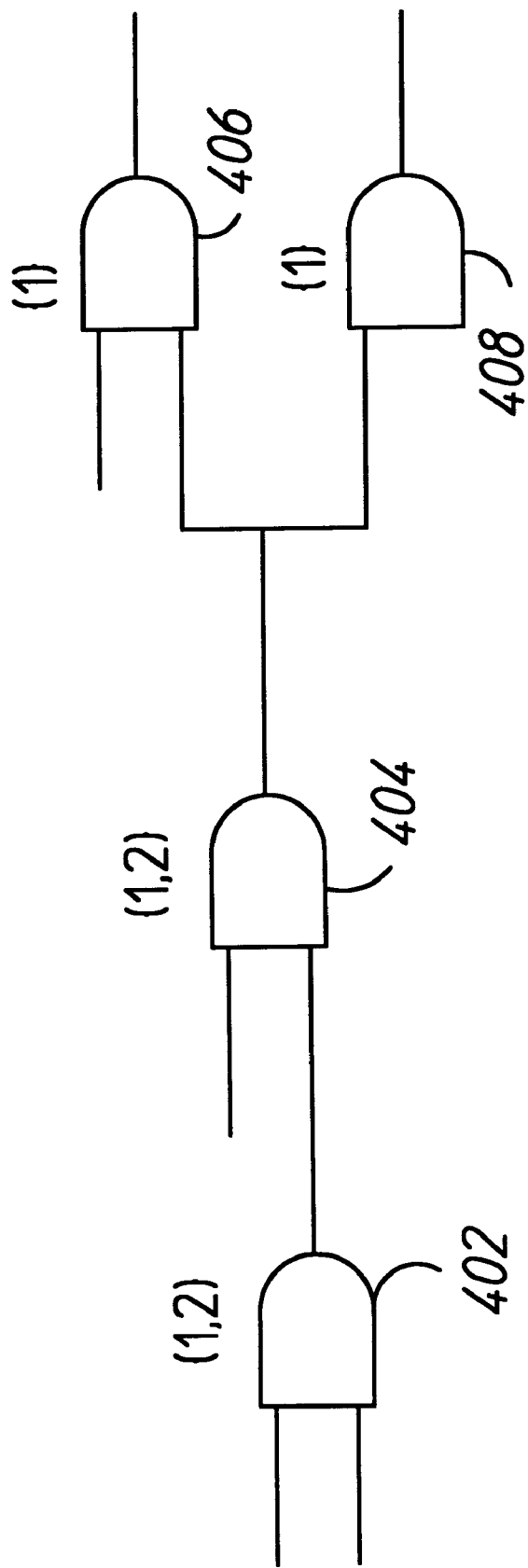
FIG. 4 illustrates a circuit fragment with phase sets for each gate.

The circuit compiler then removes unnecessary phases from each gate's phase set 314. An unnecessary phase is one which may be removed from the gate's phase set without affecting the results of the simulation. For example, take the circuit fragment shown in FIG. 4. Assume there are two clock phases numbered 1 and 2. The phase sets for each gate in FIG. 4 are shown in brackets above the gate. Gate 402 has a phase set consisting of phases 1 and 2. The output of gate 402 is connected to an input of gate 404. Gate 404 has a phase set that consists of phases 1 and 2. The output of gate 404 connects to an input of gate 406 and an input of gate 408. Gate 406 has a phase set which consists only of phase 1. Gate 408 has a phase set which consists only of phase 1. Because gate 404 has both phase 1 and phase 2 in its phase set, the compiler would normally place code for gate 404 in both phase program 1 and phase program 2. The code for phase program 2, however, is unnecessary. The value computed by the code for 404 during phase 2 will not be used during phase 2 because neither 406 or 408 have phase 2 in their phase set. Further, it will not be used in the following phase 1 because phase 1 is in 404's phase set and therefore it will be overwritten before it can possibly be used. Therefore, placing code for gate 404 in the phase 2 program is unnecessary. To prevent code for gate 404 from being placed in the phase 2 program, the compiler would drop phase 2 from gate 404's phase set.

This can lead to further unnecessary phases being eliminated for other gate's phase sets. For example, after phase 2 has been dropped from gate 404's phase set, the presence of phase 2 in gate 402's phase set is unnecessary and phase 2 may be dropped from gate 402's phase set. Pseudo code to eliminate unnecessary phases from all the gate's phase sets, and hence eliminate unnecessary gate evaluations when code is generated, is included below.

The algorithm makes use of a stack of gates and assumes that there are N phases. NOTE: mod operator is modulo operator and is used to handle phase wrap around. i.e. the fact that phase 0 follows the last phase (phase N−1). Pseudo code to eliminate unnecessary phases from all the gate's phase sets, and hence eliminate unnecessary gate evaluations when code is generated follows:

```
drop_unecessary_bases( )
{
    let the stack be empty;
    for (each gate in the circuit(current gate is g1)) {
        push g1 onto the stack;
        while (the stack is not empty) {
            pop a gate off the stack (popped gate is g2);
            let n2 be the node driven by g2;
            /* x is a set of phases */
            if(n2 is not a debug node) {
                let x = extra_phases(g2, n2);
                if(x is not empty) {
                    delete each member of x from the phase
                    set for g2;
                    for (each gate which drives an input of g2
                        (current gate is g4)) {
                            push g4 onto the stack;
                    }
                }
            }
        }
    }
}
extra_phases(g2, n2)
{
    /* g2 is a gate */
    /* n2 is g2's output node */
    let x be an empty set;
    let d_set be the union of the phase sets
        of all gates which drive n2 (including g2);
    let r_set be the union of the phase sets
        of all gates which receive n2;
    for (each phase in the phase set for g2
        (current phase is p)) {
            for(q = p + 1;q < p+1+N;q++) {
                if(phase (q mod N) is a member of d_set) {
                    break;
                }
            }
            for(r = p;r < p+N;r++) {
                if(phase r mod N) is a member of r_set) {
                    break;
                }
            }
            if(q <= r) {
                insert phase p into x
            }
    }
    return x
}
```

After unnecessary phases are dropped for each gate's phase set 314, the circuit compiler generates a phase program for each phase 316. After generating the phase programs, the circuit compiler is done 318. The phase programs (possibly after compilation) consist of computer instructions. For example, to simulate an AND gate, the compiler might generate the following line in C:

NODE3=NODE1 & NODE2;

which results in the following set of assembly language instructions:

|       |            |
|-------|------------|
| LOAD  | NODE1,R1   |
| LOAD  | NODE2,R2   |
| AND   | R1,R2,R3   |
| STORE | R3,NODE3   | where NODE1 and NODE2 are the node variable names for the two inputs to the AND gate and NODE3 is the node variable name for the output of the gate. This code is adequate to simulate the a logical AND gate for one simulation.

In a typical computer, registers R1, R2, and R3 are larger than 1 bit. The number of bits in these registers is called the natural word size which will be referred to as WS. A typical modern workstation computer would have a natural word size (WS) of either 32 or 64 bits. Because of this, one way to improve the performance of the simulator is to have it perform WS independent simulations in parallel. By packing the node variables for WS independent simulations into NODE1, NODE2, and NODE3, the AND gate in all WS simulations may be simulated with the exact same code shown above. This is called multi-threaded simulation. Furthermore, since the same code is used, a multi-threaded simulation executes in the same amount of time as a single simulation. This allows WS simulation jobs to complete in the time it would take to complete one simulation job without multi-threading.

Figure 5:
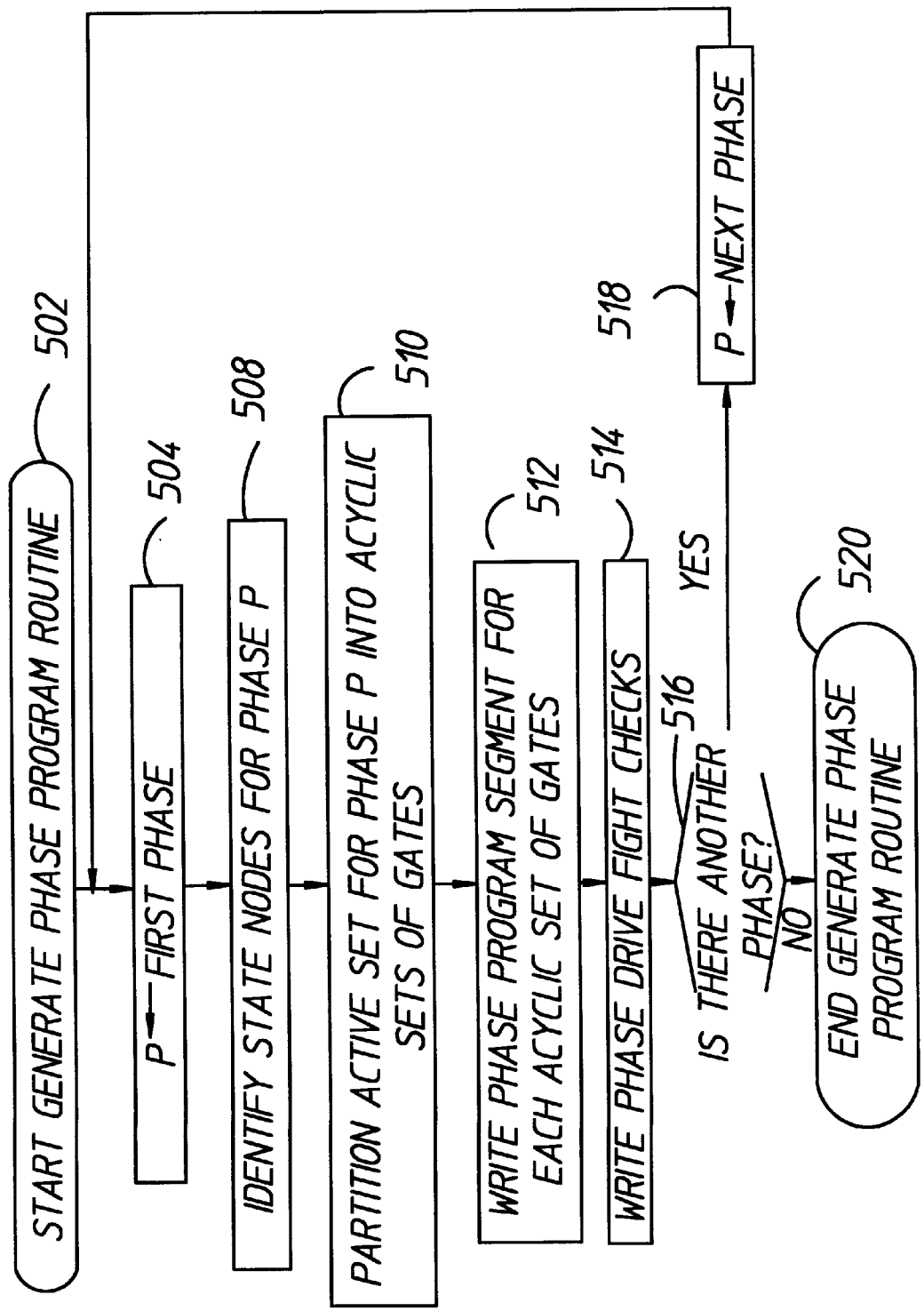
FIG. 5 further illustrates the steps taken to generate phase programs.

The process of generating the phase programs 316 is detailed further in FIG. 5. After the generate phase programs routine starts 502, elements 504, 516, and 518 form a loop which causes each phase program to be produced one at a time. This looping is controlled by box 504 which initializes the current phase, P, to the first phase and proceeds on to element 508. After the steps for generating the phase program are complete, element 516 will cause the routine to end 520 if all of the phase programs have been generated. If there are still phase programs which have not been generated, element 518 sets P to the next phase and loops back to element 506.

The next step in the loop is to identify state nodes for this phase. State nodes are nodes which are computed in the current phase and needed in a succeeding phase. State node must hold their value between the execution of the current phase program and the execution of a succeeding phase program. All other nodes are temporaries and may be discarded after they are no longer needed in the current phase program. Identifying the state nodes allows certain optimizations to be performed when the code for the phase program is generated. To illustrate, consider the following phase program fragment written in C:

NODE3=NODE1 & NODE2; NODE5=NODE3|NODE4;

In a typical assembly language, this would be:

```
; NODE3 = NODE1 & NODE2 ;
LOAD      NODE1,R1
LOAD      NODE2,R2
AND       R1,R2,R3
STORE     R3, NODE3 ; potentially unnecessary instruction
; NODE5 = NODE3 | NODE4 ;
LOAD      NODE4,R4
OR        R3,R4,R5
STORE     R5,NODE5
```

If NODE3 is a temporary node, and there are no later uses of NODE3, then the instruction marked above as potentially unnecessary may be removed or never generated. The phase program would executes faster without the extra instruction because there are fewer instructions to execute and fewer store operations reduce the number of main memory accesses necessary. Pseudo code for identifying state nodes is included below.

The pseudo code assumes that there are N phases. NOTE, the mod operator is the modulo operator and is used to handle phase wrap around. i.e. the fact that phase 0 follows the last phase (phase N-1). Pseudo code for identifying state nodes follows:

```
mark_state_nodes(p)
{
    /* p is the current phase */
    /* N is the number of phases */
    for (each node in the circuit (current node is n)) {
        let d_set be the union of the phase sets
        of all gates which drive n;
        let r_set be the union of the phase sets
        of all gates which receive n;
        if (p is in d_set) {
            for (q = p+1; q < p+1+N; q++) {
                if ((q mod N) phase is a member of d_set) {
                    break;
                }
            }
            for (r = p+1; r < p+1+N; r++) {
                if ((r mod N) phase is a member of r_set) {
                    break;
                }
            }
            if(r < q) {
                mark n as a state node;
            }
            else {
                mark n as a temporary node;
            }
        }
        else {
            n is not driven in p, so state vs temp distinction
            is meaningless;
        }
    }
}
```

Figure 6:
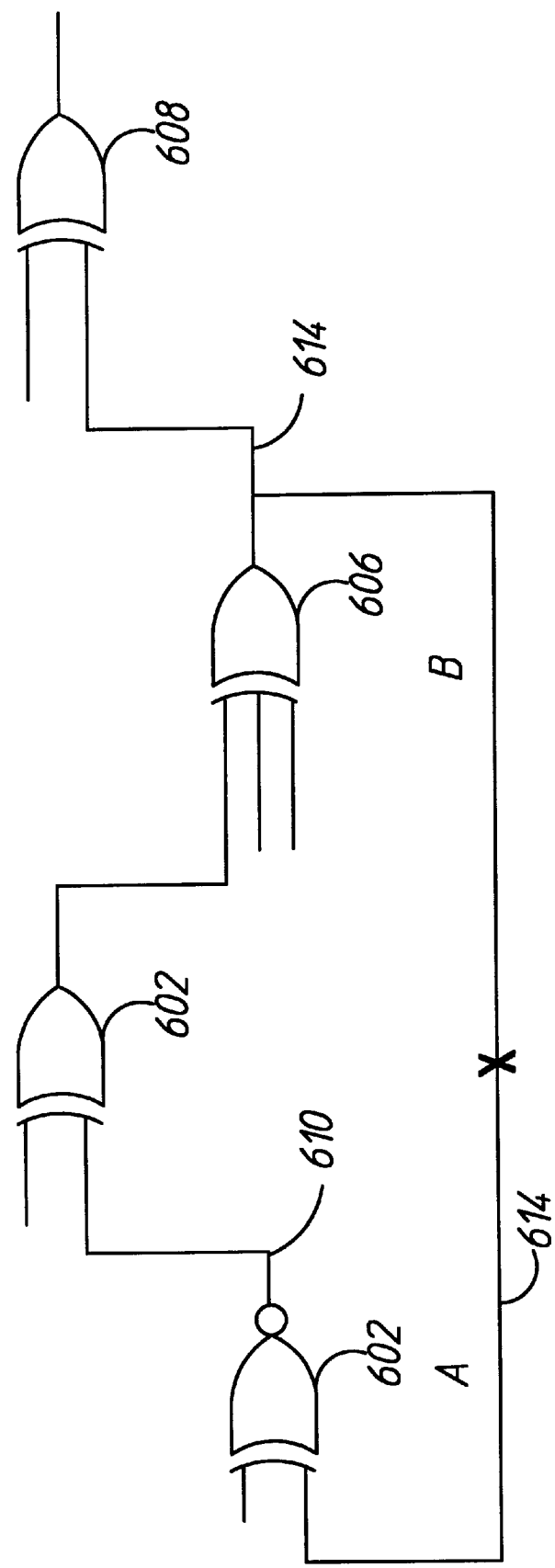
FIG. 6 illustrates a cyclic set of gates and a cut node to break the cycle.

The step the compiler takes in generating a phase program is to partition the active set for the current phase into acyclic sets of gates 508. An acyclic set of gates does not contain any path from the output of a gate back to the input of the same gate. FIG. 6 illustrates a non-acyclic (i.e. cyclic) set of gates. Note the path from the output of gate 602 through gates 604 and 606 back to an input of gate 602. Many gates in a circuit are not part of a cycle. These gates automatically belong to an acyclic set of gates. Gate 608 is an example of a such a gate. However, gates 602–606 are part of a cycle so they may not be partitioned into an acyclic set without the circuit compiler taking some special action.

The circuit compiler solves this problem by creating a new acyclic set of gates out of those gates which are part of a cycle. For example, to create an acyclic set of gates from the cyclic set shown in FIG. 6, the compiler would break node 614, which is the output of gate 606, into two separate nodes labeled A and B. This is shown by the "X" on node 614 in FIG. 6. The node chosen to be broken into two separate nodes is called a cut node. Breaking the cut node into two separate nodes eliminates the cycle which made the gates part of a cyclical set.

When generating code for a new acyclic set of gates which was formerly a cyclic set of gates, the circuit inserts several lines of code to cause the phase program to loop through the code for the new acyclic set until nodes A and B stabilize at the same value. Because the phase program is going to loop though the code for the new acyclic set of gates, it is important for only those gates which are part of the cycle to be included in the loop. This avoids any extra instructions having to be repeatedly executed until nodes A and B stabilize.

After the active set has been partitioned into acyclic sets of gates, there is a set containing gates which were not part of a cycle, and a set for each cycle containing the gates of that cycle. The gates that were not part of a cycle do not need to be included in a loop when code is generated for a phase program.

The next step the circuit compiler takes is to generate a phase program segment for the gates in each acyclic set of gates 512. If the set is comprised of gates in a cycle, the compiler adds code to loop through that code segment until each of the cut node's two variables stabilize.

Finally, before looping back 516, 518 and generating the next phase program, the circuit compiler generates code and adds it to the phase program which will detect if a drive-fight has occurred during the current phase between two or more gates 514. If a drive-fight is detected, the user will be notified. After all the phase programs have been generated, the generate phase program routine is done 520.

Figure 7:
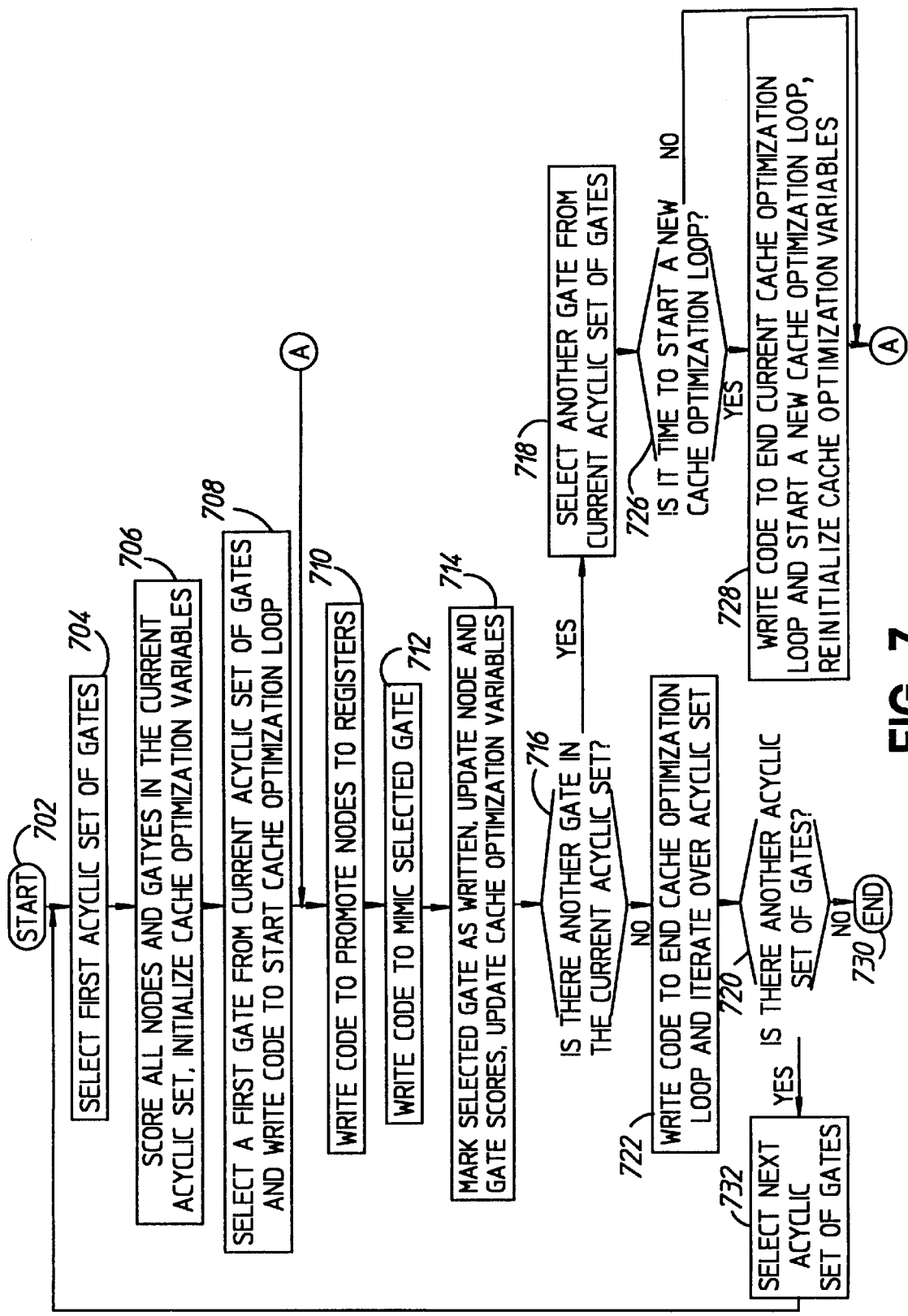
FIG. 7 further illustrates the steps taken to generate a phase program.

The step of generating a phase program segment for each acyclic set of gates 512 is further detailed in FIG. 7. At the start of the routine 702, which generates a phase program segment for each acyclic set of gates, a first set acyclic set of gates is selected 704. Then a score is calculated for all the nodes, and the gates in the acyclic set and the variables used to optimize cache performance are initialized. This scores calculated for the nodes and gates will be used later to aid in selecting the next gate to be processed, or which node to displace from a register. While calculating a score for each node and each gate in the active set, the circuit compiler creates a data structure called a heap so it can easily find the gate, or node, with the highest score. The algorithms for creating and maintaining a heap are well known in the software art.

After this step, the circuit compiler selects a gate from this acyclic set of gates and writes code to initiate a loop which optimizes cache performance 708. The cache optimization looping is discussed in further detail, below. To select this gate, the circuit compiler uses the gate scores calculated in step 706. After selecting a gate, the circuit compiler needs to generate phase program code which will simulate the operation of the selected gate. This process consists generating code which will move the node variables for the inputs to the gate into machine registers if they are not already there 710. To select which registers to store the node variables in, the circuit compiler uses the node scores calculated in step 706. After code has been generated which loads the appropriate node variables into registers, the circuit compiler generates code which will mimic the operation of the selected gate 712. Then the circuit compiler will mark the selected gate as having been written, update the node and gate scores, and update the variables which are used to optimize cache performance 714. This step may consist of deleting the gate from the heap and then updating the scores and the heaps for both nodes and gates. If there is another gate in the current acyclic set of gates 716, the circuit compiler selects another gate using the gate scores 718. If there is not another gate in the current acyclic set of gates 716, the circuit compiler writes code to end the cache optimization loop, writes code to iterate over the current acyclic set of gates until stable 722.

The circuit compiler then checks to see if there is another acyclic set of gates 720. If there are no more acyclic sets of gates left, the circuit compiler is done generating the current phase program 730. If there is another acyclic set left, the circuit compiler selects another acyclic set of gates 732 and loops back to element 706.

If there was another gate in the current acyclic set of gates back at step 716, the circuit compiler selects another gate using the current node and gate scores 718. The circuit compiler then checks to see if it is time to start a new cache optimization loop. If it not time to start a new cache optimization loop, the circuit compiler loops back to element 710 to write the code necessary to mimic the currently selected gate. If it is time to start a cache optimization loop, the circuit compiler writes code which ends the current cache optimization loop, writes code to begin a new cache optimization loop, and re-initializes the variables used to determine when to start a new cache optimization loop 728. Then the circuit compiler loops back to element 710 to write code for the current gate. The steps detailed in FIG. 7 produce code which has a general structure depicted in pseudo code as follows:

```
do{     /* first acyclic set of gates */
        for(cache optimization loop) {
            boolean operations, loads, stores, etc. for many gates
        }
        for( cache optimization loop) {
            boolean operations, loads, stores, etc. for many gates
        }
        ...
        for(cache optimization loop) {
            boolean operations, loads, stores, etc. for many gates
        }
}while(cut nodes not stable);
do{     /* next acyclic set of gates */
        for(cache optimization loop) {
            boolean operations, loads, stores, etc. for many gates
        }
        for(cache optimization loop) {
            boolean operations, loads, stores, etc. for many gates
        }
        ...
        for(cache optimization loop) {
            boolean operations, loads, stores, etc. for many gates
        }
}while(cut nodes not stable);
...
do{     /* last acyclic set of gates */
        for(cache optimization loop) {
            boolean operations, loads, stores, etc. for many gates
        }
        for(cache optimization loop) {
            boolean operations, loads, stores, etc. for many gates
        }
        ...
        for( cache optimization loop) {
            boolean operations, loads, stores, etc. for many gates
        }
}while(cut nodes not stable);
```

Figure 8:
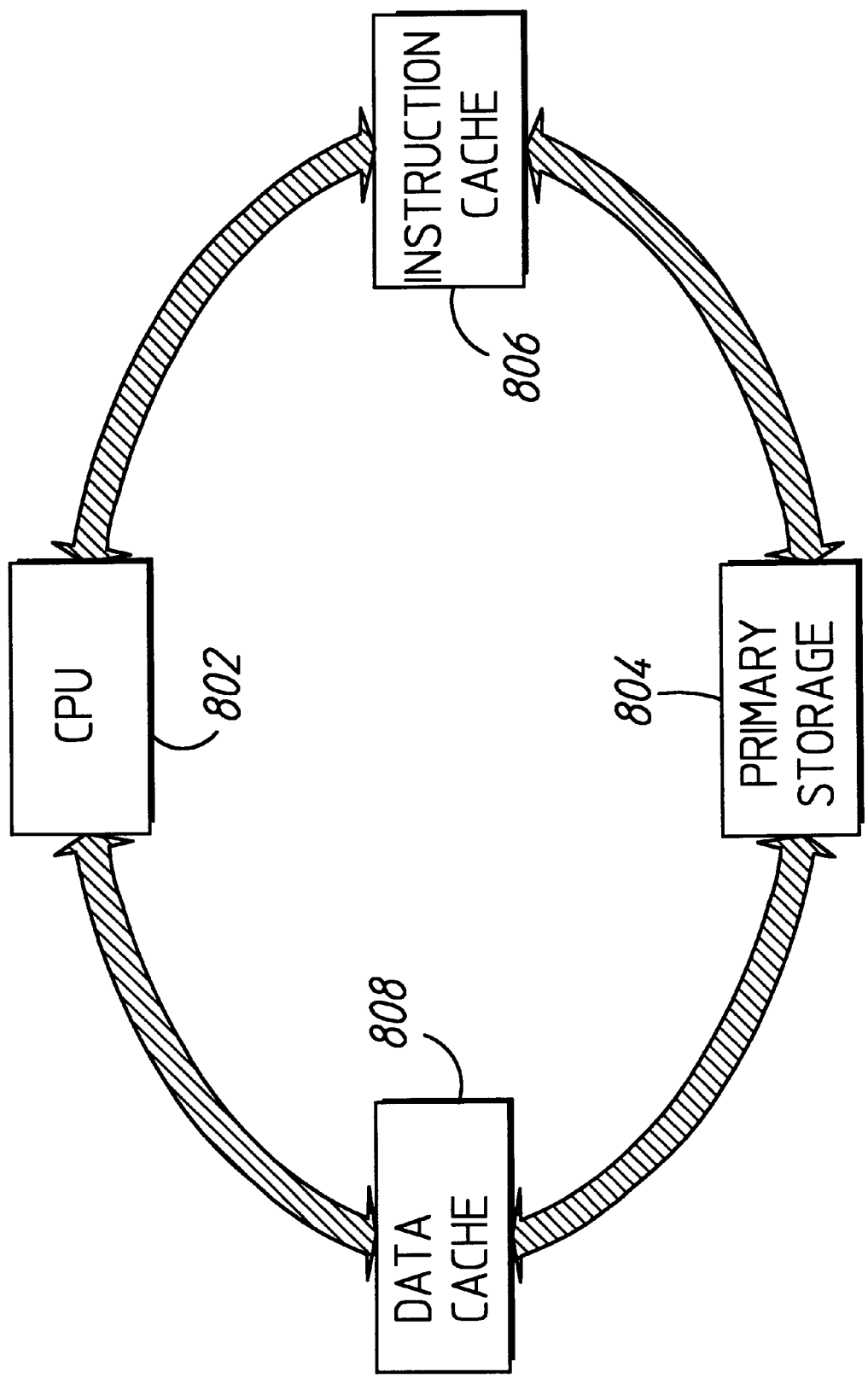
FIG. 8 illustrates a computer for running the code generated by the circuit compiler.

To further understand the cache optimization loops, some background is necessary. FIG. 8 shows a typical modern computer running the simulator and phase programs. This computer has a CPU 802, an instruction cache (I-cache) 806, a data cache (D-cache) 808, and primary storage 804. The I-cache 806 contains a copy of instructions which have been recently executed. The behavior of a typical program results in most instructions to be executed residing in the I-cache 806. Therefore, the I-cache 806 speeds execution because fetching instructions from the I-cache 806 is faster than fetching instructions which only reside in primary storage 804.

When an instruction is fetched which does not reside in the I-cache 806, it is placed in the I-cache 806 generally displacing some other instruction. This event is called an I-cache miss. An I-cache miss has a substantial time penalty associated with it because the instruction must be retrieved from the much slower primary storage 804 before the computer may resume execution. Fetching an instruction which is contained in the I-cache 806 is called an I-cache hit.

The D-cache 808 is similar to the I-cache 806 except that it holds data values rather than instructions. The D-cache 808 contains a copy of data which has been recently accessed. The behavior of a typical program results in most data being accessed residing in the D-cache 808. Therefore, the D-cache 808 speeds execution because fetching data from the D-cache 808 is faster than fetching data which resides only in primary storage 804.

Primary storage 804 is divided into blocks called lines. The number of bytes in a line is called the line size. Transfers of data between primary storage 804 and the D-cache 808 occur in units of the line size. When a data value is accessed which does not reside in the D-cache 808, the line containing it is placed in the D-cache 808 generally displacing another line. This event is called a D-cache miss. A D-cache miss has a substantial time penalty associated with it because the line must be retrieved from the much slower primary storage 804 before the computer may resume execution. Accessing data which is contained in the D-cache 808 is called a D-cache hit.

A typical computer implements a D-cache 808 using a structure called a set-associative cache. A set-associative cache can be thought of as a two dimensional table with each entry in the table being a line. The rows of the table are called sets. Every set can contain A lines, where A is the associativity of the cache. Therefore, the number of columns in the table is equal to the associativity of the cache, A. The number of rows in the cache is equal to the number of sets in the cache which will be referred to as NS.

To locate a piece of data in a set-associative cache, a field of the desired data's address is used to select one of the sets in the cache. Then the address of each of the A lines which occupy that set is compared against the address of the line containing the desired data. If there is a match, a D-cache hit results. Otherwise, a D-cache miss results.

Figure 9:
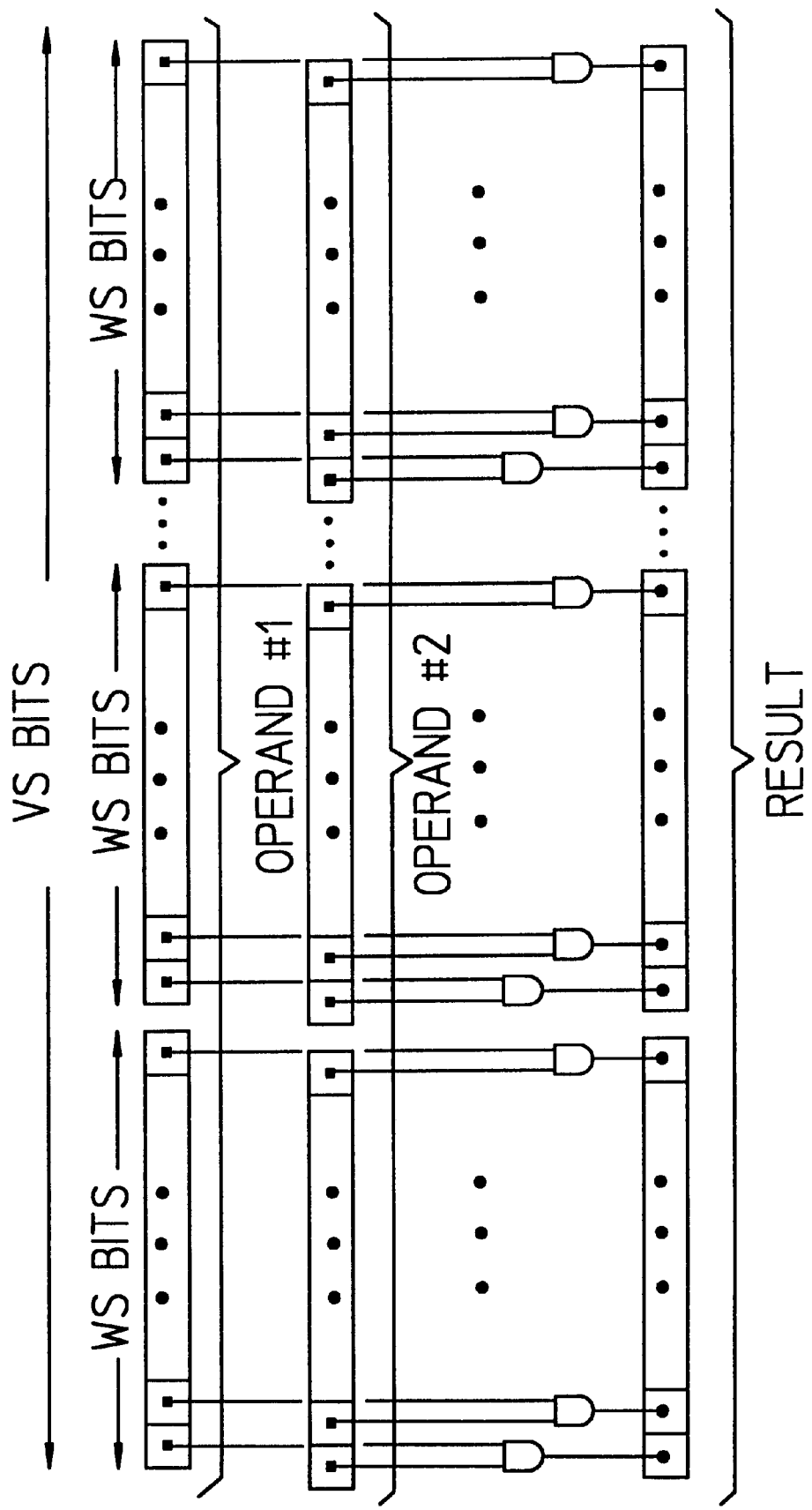
FIG. 9 illustrates the process of computing the output of an AND gate for VS number of simulations jobs.

The node variables may be widened to a larger multiple of WS. The size of the node variables is designated VS, where VS is an integer multiple of WS. The process of computing the output of an AND gate for VS number of simulations is illustrated in FIG. 9. Because the machine executing the phase program cannot manipulate objects greater than WS bits wide, it is necessary for the compiler to create loops in the phase program. Each time through these loops will compute the result of WS simulations and it will take VS/WS times through the loop to compute all VS simulations. To illustrate, the circuit compiler might produce the following C code segment to compute the output of the AND gate, above, but for VS simulation jobs instead of one:

```
for( w=0; w<VS/WS; w++ ) {
    NODE3[w]=NODE1[w] & NODE2[w];
}
```

The code for computing the output of more than one gate may be placed inside the loop. This improves performance because the overhead necessary to keep track of the loop variable is amortized over more gates. This process could be carried to the extreme where one loop would contain the code for computing all the gates in the circuit. This may exceed several million statements for large circuits. The circuit compiler, however, will not create loops which are larger than the capacity of the target machine's I-cache. This improves the performance of the simulator.

When a phase program is executed, the number of I-cache misses that result from the first iteration of the loop is the same as if there was no looping. However, because the circuit compiler makes sure the loop is smaller than the capacity of the I-cache, all of the instructions in the loop are contained in the I-cache after the first iteration and each successive iteration will result in no I-cache misses. Therefore, execution efficiency is improved because the time penalty associated with the I-cache misses is amortized over VS simulation jobs instead of WS simulation jobs. These loops are the cache optimization loops referred to above. To determine when to start a new cache optimization loop because the I-cache is full, the circuit compiler accumulates a count of how many gates have been processed. When this count reaches a certain value, a new cache optimization loop is started. For example, if it is assumed that each gate will take, on average, three instructions to mimic, the count may be accumulated by three each time and when the count reaches a number which matches the size of the target machine's I-cache, a new cache optimization loop is started.

Once a D-cache line has been loaded into the D-cache, it remains there until it is displaced. A D-cache line is displaced when a new piece of data that maps into that line's D-cache set is needed and all the lines of that set are filled with other data. The cache optimization loops further improve performance by ending one cache optimization loop and beginning the next before there is a reference to a node variable which would cause the displacement of a D-cache line compiler in that loop. In other words, the circuit compiler generates code where there are no more than A references to node variables within a cache optimization loop that map to the same set. A is the associativity of the cache. When a statement is about to be written which would violate this rule, the current cache optimization loop is terminated and a new cache optimization loop initiated.

To accomplish this, the circuit compiler maintains a model of the D-cache of the target machine. This model may be as simple as an array of NS lists, where each list corresponds to a set. Each of the NS lists contains the addresses of D-cache lines currently occupying that set. When starting a new cache optimization loop, the circuit compiler initializes the modeled D-cache to an empty state. After writing the code for a gate, the simulator updates the modeled D-cache. For each node variable referenced by the code, the circuit compiler locates the set that the node variable maps to. If the set already contains the line in which the node variable resides, then no action is needed. Otherwise, this line is added to the set.

Before writing the code for a gate, the circuit compiler verifies that none of the node variables needed to mimic the gate conflict with the current contents of the modeled D-cache. For each node variable, the circuit compiler locates the set that the node variable maps to. If the set already contains the line in which the node variable resides, then there is no conflict. However, if the set does not contain the line, and the number of lines already in the set is greater than or equal to A, then a conflict occurs and a new cache optimization loop is started. Therefore, there are two conditions which result in a new cache optimization loop being started 726. One condition is when the I-cache will be full or nearly full, and another is when an operation would result in a D-cache conflict.

Adding these cache optimization loops improves the efficiency of the code generated by the circuit compiler because, when the code is executed, the time penalty associated with retrieving from main memory all the instructions executed in the loop and all the data used in the loop is amortized over VS simulation jobs instead of WS simulation jobs.

When generating the code to mimic the operation of a gate 712, the circuit compiler handles tri-state buffers in a special manner. A tri-state buffer is a three-terminal device with an input, an output, and an enable. When the enable is a logic high, the tri-state buffer drives its input to its output. When the enable is a logic low, the tri-state buffer allows its output to float. In this case, the output node of the tri-state buffer will either be driven by some other tri-state buffer which has its enable input high, or it will retain its value from the previous phase. The output node of the tri-state buffer retains its value from the previous phase when all of the tri-state buffers which drive the node have enables which are a logic low.

A common approach to mimicking a tri-state buffer would be the following pseudo code:

```
for( j=0; j<VS; j++ ) {
    if( bit j of enable node is a 1) {
        bit j of the output node variable = bit j of the input
            node variable
    }
}
```

This is very inefficient for a multi-threaded simulation because the phase program must loop once for each simulation job.

The approach taken by the circuit compiler is to generate only boolean operations in the phase program to simulate the operation of a tri-state buffer. To simulate a tri-state buffer, the circuit compiler outputs code which is equivalent to:

output=( enable & input )|( ~enable & output);

This code may be implemented in three or four machine instructions without having to loop.

Figure 10:
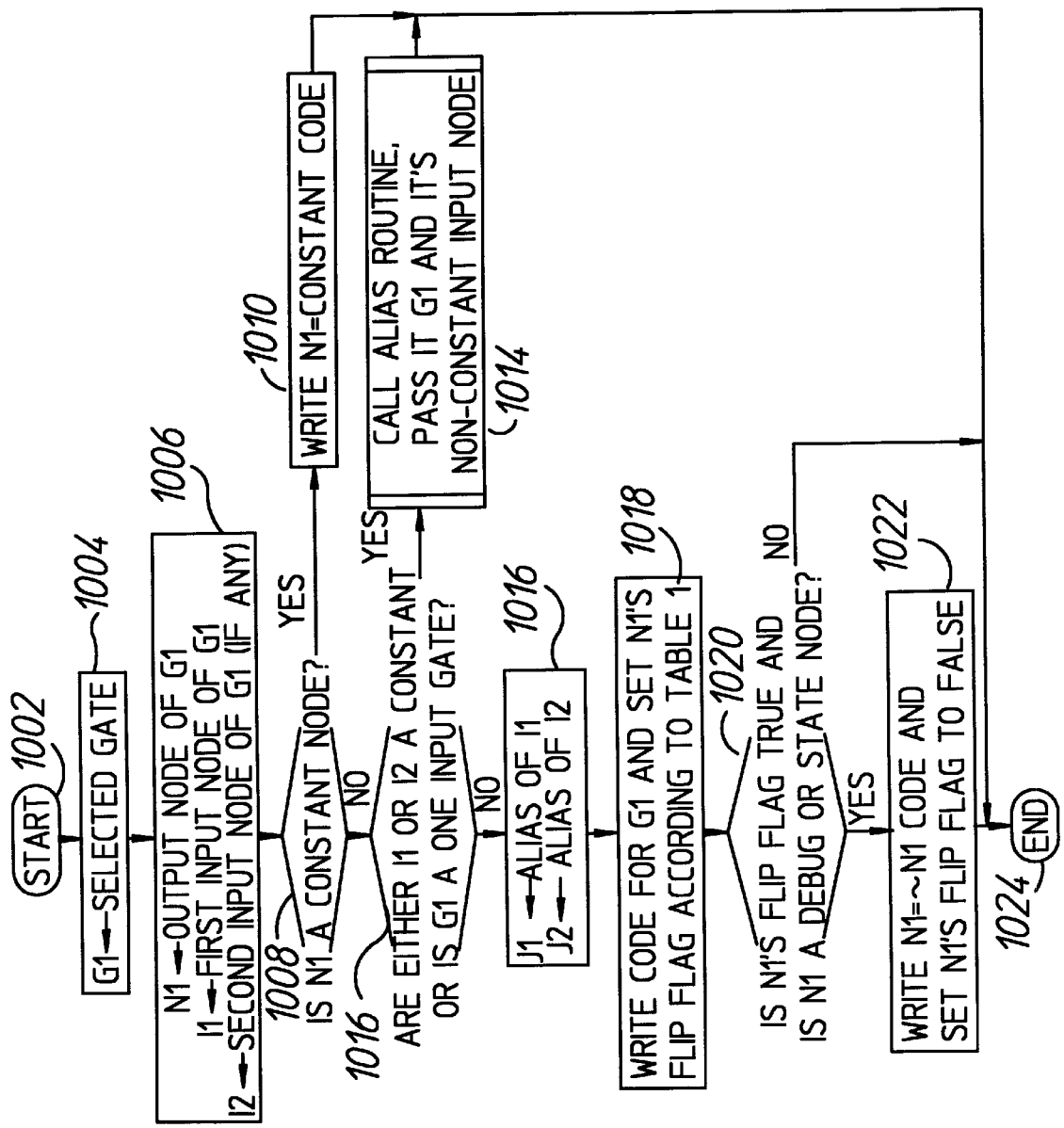
FIG. 10 illustrates the process for generating code.

FIG. 10 further details the step of generating code to mimic the operation of a gate 712. In particular, FIG. 10 details steps taken by the circuit compiler to perform the following optimizations: (1) If a gate has a constant output as established by element 310, then no boolean operations need to be generated. Instead, code is generated which sets the output node variable of the gate to the constant value. (2) If a two input gate has a constant input as established by element 310, then it can be treated as a single input gate (i.e. a buffer or inverter.) For example, a 2-input NAND gate with one input which is a constant one may be treated as an inverter. (3) Inverting gates, such as a NAND or NOR, require two instructions to implement on most computers. For example, performing a NAND would require the instructions:

| AND | R1,R2,R3 |
| NOT | R3,R4 |

To address this, the circuit compiler maintains a flag called flip for every node. If the circuit compiler determines that it is more efficient to generate the complement function for a node, (i.e. eliminate the NOT instruction, above) it will do so, and set the flip flag. If the flip flag is set when using the node in the future, the compiler will compensate for the inversion when generating the code for gates which use this node. (4) Generating code for buffers and inverters is avoided whenever possible. The circuit compiler accomplishes this by maintaining a pointer called alias. Normally, the alias pointer points to the node itself which is equivalent to an unaliased node. When processing a buffer or inverter, the circuit compiler avoids generating code to copy the input node variable of the buffer to the output node variable. Instead, the circuit compiler sets the alias pointer for the output node to the input node and sets the flip flag for the output node if appropriate. Any future use of the output node will now result in the circuit compiler generating code which actually uses the node pointed to by the alias pointer (i.e. the input node will be used.)

In FIG. 10, the selected gate will be referred to as G1 1004. The output node of G1 is called N1. The first input node is called I1. The second input node, if any, is called I2 1006. If the method of FIG. 10 is implemented as a subroutine, steps 1004 and 1006 may be implemented as assignments of variables passed to the subroutine. The next step checks to see if N1 is a constant node 1008. If it is, the circuit compiler writes code which copies the constant value into node variable N1 1010. After that, the circuit compiler is done generating code for that gate 1024. If N1 is not a constant node, the circuit compiler checks to see if either I1 or I2 is a constant node, or if G1 is a one input gate 1012. If the answer is yes, the circuit compiler knows that this gate is effectively a buffer so it calls a routine which aliases the output node, N1, to the non-constant input node 1014. After aliasing the output node, the circuit compiler is done generating code for that gate 1024. If neither I1 or I2 is a constant node, and G1 is not a one input gate, the circuit compiler assigns J1 to be the alias of I1 and J2 to be the alias of I2 1016. Accordingly, if I1 or I2 is aliased, J1 and J2 will be the nodes which were buffered or inverted to generate I1 and I2, respectively. The circuit compiler now writes code for gate G1 and sets N1's flip flag 1018. This code is written by taking G1's logical function, and the status of J1 and J2's flip flag and looking up the appropriate output operation and status of N1's flip flag in Table 1. In Table 1, a "~" means a logical NOT, a "&" means a logical AND, a "|" means a logical OR, and a "^" means a logical XOR. After writing the code for gate G1 and setting N1's flip flag 1018 the circuit compiler checks to see if N1's flip flag is true and N1 is either a debug or state node. If yes, then the circuit compilers writes code to invert N1 and sets N1's flip flag to false 1022. This ensures that debug and state nodes are always stored with the correct polarity. The circuit compiler is then done generating code for gate G1 1024. The circuit compiler is also done if N1's flip flag was not set, or G1 was not a state node or a debug node. The steps in FIG. 10 are also shown in pseudo code below.

In the pseudo code below, initially the flip flag is false for all nodes and the alias pointer for each gate (n.alias) is set to point back at that gate. The steps in FIG. 10 shown in pseudo code follow:

```
write_code_for(g1)
{
    /* g1 is the selected gate */
    let n1 be the output node of g1;
    let i1 be the first input node of g1;
    let i2 be the second input node of g1 (if applicable);
    if(n1 is a constant) {
        if(n1 is a constant one) {
            output "<n1.name> = 0xFF . . . F";
        }
        else {
            output "<n1.name> = 0";
        }
    }
    else {
        if(g1 is a 2-input gate) {
            it(i1 is a constant) {
                call alias(g, i2, n);
            }
            else if(i2 is a constant) {
```

-continued

```
            call alias(g1, i1, n1);
        }
        else {
            j1 = *i1.alias;
            j2 = *i2.alias;
            Lookup and output the operation from Table 1;
            n1.flip = value prescribed by Table 1;
            if(n1.flip is true) {
                if(n1 is a debug node n1 is a state node) {
                    output "<n1.name> = ~<n1.name>";
                    n1.flip = false;
                }
            }
        }
    }
    else {
        call alias(g1, i1, n1);
    }
  }
}
alias(g, i, n)
{
    /* g is the selected gate */
    /* i is its input node */
    /* n is its output node */
    if(n is a debug node || n is a state node) {
        j = *i.alias;
        if (i.flip XOR (whether g is an inverting gate)) {
            output "<n.name> = ~<j.name>";
        }
        else {
            output "<n.name> = <j.name>";
        }
    }
    else {
        n.alias = i.alias;
        n.flip = i.flip XOR (whether g is an inverting gate);
    }
}
```

TABLE 1

| line # | Gate Type | J1's flip flag | J2's flip flag | Output Operation | N1's flip flag |
|---|---|---|---|---|---|
| 1 | AND | 0 | 0 | J1 & J2 | 0 |
| 2 | AND | 0 | 1 | J1 & ~J2 | 0 |
| 3 | AND | 1 | 0 | J1 & J2 | 0 |
| 4 | AND | 1 | 1 | J1 \| J2 | 1 |
| 5 | NAND | 0 | 0 | J1 & J2 | 1 |
| 6 | NAND | 0 | 1 | J1 & ~J2 | 1 |
| 7 | NAND | 1 | 0 | ~J1 & J2 | 1 |
| 8 | NAND | 1 | 1 | J1 & J2 | 0 |
| 9 | OR | 0 | 0 | J1 \| J2 | 0 |
| 10 | OR | 0 | 1 | ~J1 & J2 | 1 |
| 11 | OR | 1 | 0 | J1 & ~J2 | 1 |
| 12 | OR | 1 | 1 | J1 & J2 | 1 |
| 13 | NOR | 0 | 0 | J1 \| J2 | 1 |
| 14 | NOR | 0 | 1 | ~J1 & J2 | 0 |
| 15 | NOR | 1 | 0 | J1 & ~J2 | 0 |
| 16 | NOR | 1 | 1 | J1 & J2 | 0 |
| 17 | XOR | 0 | 0 | J1 J2 | 0 |
| 18 | XOR | 0 | 1 | J1 J2 | 1 |
| 19 | XOR | 1 | 0 | J1 J2 | 1 |
| 20 | XOR | 1 | 1 | J1 J2 | 0 |
| 21 | XNOR | 0 | 0 | J1 J2 | 1 |
| 22 | XNOR | 0 | 1 | J1 J2 | 0 |
| 23 | XNOR | 1 | 0 | J1 J2 | 0 |
| 24 | XNOR | 1 | 1 | J1 J2 | 1 |

Table 1 was constructed with the following considerations: (1) The need to generate NOT operations can be reduced or eliminated by generating the complement of the required function and compensating by complementing the output node's flip flag. Taking line 4, for example, the literal operation, ~J1 & ~J2, would require two NOT operations. The simplification using Demorgan's theorem and setting the flip flag of the output node requires no NOT operations. (J1|J2, flip flag=1). (2) Some target machines can perform the operation "R3=R1 & ~R2" with one instruction. This can be applied on lines 2 and 3. Furthermore, it can also be applied on lines 10 and 11 if the complement is generated. (3) For XOR gates, the flip flag can be used to compensate for inversions of the inputs. (4) The table entries for inverting gates are identical to the correspond entries for non-inverting gates except that the flip flag for the output node is complemented.

Figure 11:
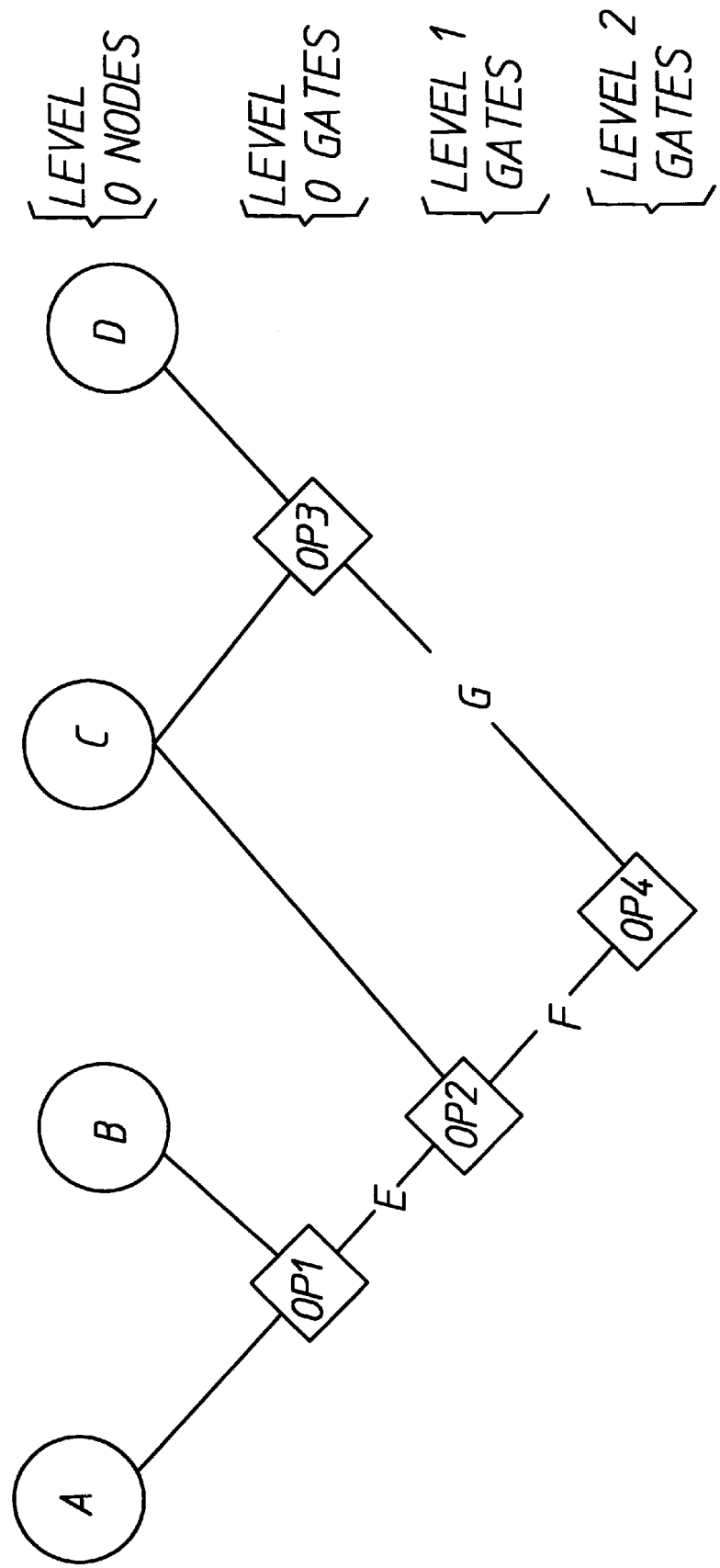
FIG. 11 illustrates a graph representing the nodes and gates of an acyclic set of gates.

Steps 708 and 718 of FIG. 7 involve selecting a gate to write code for. This selection process depends on a score which is assigned to each gate. The scores are initially calculated in step 704 and are updated in step 714 after the code for each gate is written. Because all the gates in the active set are acyclic, they may be represented by a graph similar to the one in FIG. 11. In FIG. 11, letters denote nodes and diamonds denote gates. For example, the box labeled OP2 is a gate which has node E and node C as its two inputs. The top row of nodes, A–D, are level 0 nodes. These are either circuit inputs, or nodes whose value has already been calculated. The level of a node is defined as the number of gates in the longest path from that node to a level 0 node. Accordingly, node F is a level 2 node because the longest path to a level 0 node is through gates OP2 and OP1. Likewise, nodes E and G are level 1 nodes.

Gates have levels as well. The level of a gate is defined as the maximum level of any node which is an input to that gate. For example, OP4 is a level 2 gate because it has node F and node G as inputs. Node G has a level of 1, and node F has a level of 2. Accordingly, the input to OP4 with the highest level is node F. Node F has a level of 2 so the level of gate OP4 is 2.

The circuit compiler calculates the score of a node as the sum of $1/(K^{**}\text{gate level})$ for each remaining gate in the active set that has an input connected to that node. In other words:

$$\text{node score} = \sum_{\text{gate inputs}} \frac{1}{K^{(\text{gate level})}} \quad (1)$$

where K is a constant, typically 2.

The circuit compiler uses a different formula for calculating gate scores. A gate's score is calculated as the sum of $1/(K^{}\text{gate level})$ for each input node of the gate which is currently assigned to a register plus the sum of $1/(K^{}\text{sucessor gate level})$ for each successor gate input which is assigned to a register. A successor gate is defined as any gate which directly or indirectly depends on the original gate's output. For example, OP4 is a sucessor gate of OP1, OP2, and OP3. To put it another way, the circuit compiler adds $1/(K^{}\text{gate level})$ to the gate's score for every input of that gate which is assigned to a register and adds $1/(K^{}\text{sucessor gate level})$ to the gate's score for every input of every successor gate which is assigned to a register.

When selecting a gate to write code for, it is only functionally correct to select a level 0 gate. Otherwise, code would be generated which uses input variables that have yet to be calculated or have known values. Therefore, the circuit compiler, in steps 708 and 718, selects the next gate by selecting the level 0 gate with the highest score.

Step 710 writes code to move node variables to registers. In order to do this, the circuit compiler must decide which node variables already stored in registers are to be displaced. The circuit compiler selects the node variables with the lowest node scores to be removed from registers. After the circuit compiler writes code which saves in memory the selected register (if necessary), it may write code which loads an input variable into that register, or it may use that register to store the result of a boolean operation.

Figure 12:
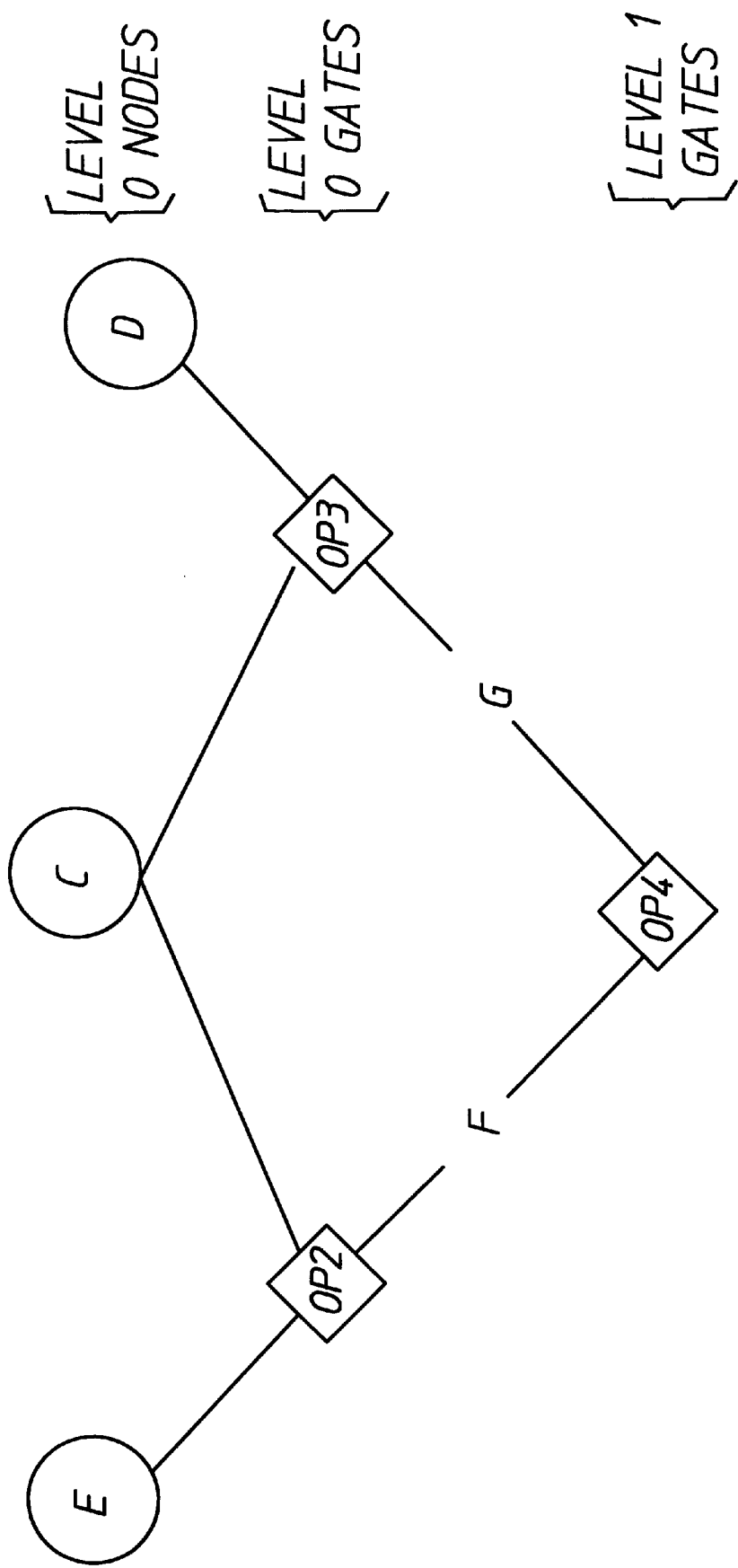
FIG. 12 illustrates the graph of FIG. 11 after a gate has been processed and the graph updated.

After the code for a gate has been written, step 714 marks the selected gate as written and updates the node and gate scores. Marking the gate as written may be viewed as deleting the gate and promoting its output node to level 0. For example, once gate OPI is written, the graph of FIG. 11 would become the graph of FIG. 12. Once this happens, the circuit compiler re-calculates the levels of all nodes and gates in the active set. The circuit compiler also re-calculates the node and gate scores. The procedures for initially calculating node and gate levels, and calculating node and gate scores, and creating and updating the node and gate heaps are detailed in pseudo code form below.

The first procedure is initializing all gate scores. This is shown in pseudo code as follows:

```
init_scores( )
{
    for (each gate in the active set (current gate is g) {
        g.level = 0;
        g.score = 0;
    }
    for (each node in the circuit (current node is n)) {
        n.level = 0;
        n.score = 0;
    }
    for (each gate in the active set (current gate is g) {
        let n be the output node of g;
        if (g.level >= n.level) {
            n.level = g.level + 1;
            call levelize(n);
        }
    }
    for (each node in the circuit (current node is n)) {
        for(each active gate which uses n (current gate is g)){
            n.score = n.score + (1/(K**g.level));
        }
    }
}
levelize(n)
{
    /* n is the node passed to routine */
    for(each active gate which receives n
    (current gate is g)){
        if(g.level < n.level) {
            g.level = n.level;
            let n2 be the output node of g;
            if(g.level >= n2.level) {
                n2.level = g.level + 1;
                call levelize(n2);
            }
        }
    }
}
```

The circuit compiler employs a heap to speed the search for the level 0 gate with the highest score. Each heap member will be a reference to a gate. Only level 0 gates will be entered into the heap. For brevity, assume a few textbook procedures. Those procedures are:

get_gate_heap( )—Interrogate the heap to find the member that references the gate with the highest score. Delete this member from the heap and return the referenced gate;

insert_gate_heap(g)—Add a new gate g into the gate heap;

update_gate_heap(g)—Reorganize the gate heap after a change to gate g's score. To facilitate this, the compiler will store along with each gate a reference to the associated heap member, if any.

The procedure for selecting a gate is shown in pseudo code form as follows:

```
select_gate( )
{
    if (gate heap is empty)
        return "DONE"
    else
        return get_gate_heap( )
}
```

The procedures for updating the node and gate scores are shown in pseudo code form as follows:

```
update_scores(g)
{
/* g is the gate that was written */
    for(each input node of g(current node is n)) {
        call decrease_node_score(n,1)
    }
    let n2 be the output node of g;
    call relevelize(n2)
}
relevelize(n)
{
/* n is a node */
    new_lev = 0;
    for (each active gate which drives n
    (current gate is g)) {
        if (g.level >= new_lev) {
            new_lev = g.level + 1;
        }
    }
    if(new_lev < n.level) {
        n.level = new_lev
        for (each active gate which receives n
        (current gate is g2)) {
            new_lev = 0;
            for (each node which drives g2
            (current node is n2)) {
                if(new_lev < n2.level) {
                    new_lev = n2.level;
                }
            }
            if(new_lev < g2.level) {
                call decrease_gate_level(g2, new_lev);
                let n3 be the output node of g2
                call relevelize(n3)
            }
        }
    }
}
decrease_gate_level(g,new_lev)
{
/* g is the gate whose level is being decreased */
/* new_lev is the new level being assigned */
    count = 0;
    for (each input node of g (current node is n)) {
        call decrease_node_score(n,
            1/K**g.level -    1/K**new_lev);
        if (n is assigned to a register) {
            count = count + 1
        }
    }
    if (count > 0) {
        call decrease_gate_score(g,
        count * (1/K**g.level - 1/K**new_lev));
    }
    g.level = new_lev;
    if (new_lev == 0) {
        call insert_gate_heap(g);
    }
}
decrease_node_score(n, amt)
{
/* n is the node to be decreased */
/* amt is the amount */
    n.score = n.score - amt;
```

-continued

```
        call update_node_heap(n);
}
decrease_gate_score(g, amt)
{
/* g is the gate whose score is being decreased */
/* amt is the amount of the decrease */
        g.score = g.score - amt;
        call update_gate_heap(g);
            for (each input node of g (current node is n)) {
                for (each active gate which drives n
                    (current gate is g2) {
                        call decrease_gate_score(g2, amt);
                }
            }
}
```

The final procedures are to adjust the gate scores whenever nodes are promoted or demoted. This is because only nodes which are currently assigned to registers affect gate scores. These procedures are shown in pseudo code form as follows:

```
        promote(n)
        {
        /* n is a node being promoted */
            for (each active gate which receives n
                (current gate is g)) {
                    call decrease_gate_score(g, -1/K**g.level);
            }
        }
        demote(n)
        {
        /* n is a node being demoted */
        for (each active gate which receives n
            (current gate is g)) {
                call decrease_gate_score(g, -1/K**g.level);
        }
        }
```

It is common in a digital circuit to have several tri-state buffers drive a single node. A drive fight occurs when at least one tri-state buffer drives a high value, and at least one tri-state buffer drives a low value onto the same node. It is desirable to detect drive fights during simulation because they ordinarily indicate a design error is present.

The circuit compiler uses an efficient method which does not involve propagating "X" or unknown circuit values. Unknown values are not propagated because doing so would double the amount of memory required for each node variable and expand the number of boolean operations required by a factor of 3. Furthermore, it is possible that an "X" value resulting from a drive fight might not propagate to a node visible to the designer. Therefore, the designer would have no knowledge that a drive fight might occur in the circuit.

To ensure the phase programs detect drive fights, the circuit compiler writes code into the phase program to check for drive fights. This code is added to the phase program after the code for all of the tri-state buffers which drive a particular node has been written. For simplicity, this code may be written at the end of the phase program after all of the active gates for that phase have had code written for them.

The code written to check for drive fights involves mostly boolean operations on node variables. This makes the code very efficient for multi-threaded simulations. The code written into the phase programs is repeated for each node which is driven by tri-state buffers. For each node, the phase program first clears an error flag. Then, for each tri-state buffer which drives that node, the following statement is executed:

error=error|enable & (IN ^ OUT);

where error is the error flag, enable is the enable node for the current tri-state buffer, and IN and OUT are the input and output of the tri-state buffer, respectively. After the above statement has been executed for all the tri-state buffers which drive a particular node, the phase program checks the error flag. If the error flag is a 1, the phase program signals an error to the user and continues on to check for a drive fight on the next node. If the error flag is a 0, the phase program remains silent and continues on to check for a drive fight on the next node.

Another way is for the phase program to clear two flags, "drive_high" and "drive_low." Then, for each tri-state buffer which drives that node, the following statements are executed:

drive_high=drive high|enable & IN;

drive_low=drive$_{13}$ low|enable & ~IN;

where enable is the enable node for the current tri-state buffer, and IN is the input of the current tri-state buffer. After the above statement has been executed for all the tri-state buffers which drive a particular node, the phase program checks if both drive_high and drive_low are high. If they are, the phase program signals an error to the user and continues on to check for a drive fight on the next node. If not, the phase program remains silent and continues on to check for a drive fight on the next node. Pseudo code for two code segments which write the above two versions of code into the phase programs to check for drive fights follows:

```
gen_fight_check1( )
{
    for(each node driven by a tristate buffer
    (current node is n)) {
        write code for "error = 0";
        for (each tristate buffer which drives n
            (current buffer is g)) {
                let <enab_node> be the name of g's enable;
                let <in_node>be the name of g's input;
                let <out_node>be the name g's output (i.e. node n;
                write code for "error = error |
                    <enab_node> & (<in_node>    <out_node>)";
                /* note means XOR */
        }
    }
    write code for "if(error) { signal_user( ) }"
}
gen_fight_check2( )
{
    for(each node driven by a tristate buffer
        (current node is n)) {
        write code for "drive_high = 0";
        write code for "drive_low = 0";
        for (each tristate buffer which drives n
            (current buffer is g)) {
                let <enab_node> be the name of g's enable;
                let <in_node> be the name of g's input;
                let <out_node> be the name g's output (i.e. node n);
                write code for "drive_high =
                    drive_high | <enab_node> & <in_node>";
                write code for "drive_low =
                    drive_low | <enab_node> & ~<in_node>";
        }
    write code for "if(drive_high & drive_low) {
        signal_user( ) }";
}
```

What is claimed is:

1. A computer operable method for increasing the efficiency of computer code generated by a circuit compiler, comprising the step of:

generating computer code from a netlist of a circuit that simulates said circuit when executed, wherein said circuit includes a tri-state gate, and wherein said computer code models said tri-state gate with computer code composed solely of boolean operations.

2. The method of claim 1, wherein said computer code is adapted to perform a plurality of simulation jobs simultaneously.

3. The method of claim 2, wherein said tri-state gate has an input node, referred to hereinafter as IN, and an output node, referred to hereinafter as OUT, and an enable input, referred to hereinafter as EN, and said computer code simulates said tri-state gate by performing the logic equation given by OUT=(EN & IN)|(~EN & OUT).

4. A computer operable method for increasing the efficiency of computer code generated by a circuit compiler, comprising the steps of:

(a) generating computer code from a netlist of a circuit that simulates said circuit, said circuit including tri-state gates, and wherein said computer code propagates only logical ones and logical zeros and not unknown values;

(b) generating computer code that checks for drive fights among said tri-state gates;

(c) generating computer code that notifies a user if a drive fight is detected.

5. The method of claim 4, wherein said computer code generated in step (a) is adapted to perform a plurality of simulation jobs simultaneously.

6. The method of claim 5, wherein said computer code generated in step (b) is adapted to detect drive fights in any one of said plurality of simulation jobs simultaneously.

7. The method of claim 6, wherein said computer code in step (c) is adapted to notify said user if a drive fight has occurred in any one of said plurality of simulation jobs.

8. The method of claim 5, wherein said computer code generated in step (a) that simulates said tri-state gate is composed solely of boolean operations.

9. The method of claim 8, wherein said computer code generated in step (b) that checks for drive fights is composed solely of boolean operations.

10. The method of claim 2, further comprising the steps of:

(a) generating computer code from a netlist of a circuit that simulates said circuit, said circuit including tri-state gates, and wherein said computer code that simulates said tri-state gates propagates only logical ones and logical zeros and not unknown values;

(b) generating computer code that checks for drive fights among said tri-state gates;

(c) generating computer code that notifies a user if a drive fight is detected.

11. The method of claim 10, wherein said computer code generated in step (a) is adapted to perform a plurality of simulation jobs simultaneously.

12. The method of claim 11, wherein said computer code generated in step (b) that checks for drive fights is adapted to detect drive fights in any one of said plurality of simulation jobs simultaneously.

13. The method of claim 12, wherein said computer code in step (c) that notifies said user if a drive fight is detected is adapted to notify said user if a drive fight has occurred in any one of a plurality of simulation jobs.

14. The method of claim 13, wherein said tri-state gates have an input node, referred to hereinafter as IN, and output node, referred to hereinafter as OUT, and an enable input, referred to hereinafter as EN, and said computer code models said tri-state gates by performing the logic equation given by OUT=(EN & IN)|(~EN & OUT).

15. The method of claim 14, wherein said computer code generated in step (b) checks for drive fights among said tri-state gates by performing the logic equation EN & (IN$\oplus$OUT).

* * * * *